United States Patent [19]

Furnival

[11] 3,977,074

[45] Aug. 31, 1976

[54] DOUBLE SIDED PRINTED CIRCUIT BOARD AND METHOD FOR MAKING SAME

[75] Inventor: Thomas J. Furnival, Kokomo, Ind.

[73] Assignee: General Motors Corporation, Detroit, Mich.

[22] Filed: Feb. 6, 1975

[21] Appl. No.: 543,348

[52] U.S. Cl. .................................. 29/625; 29/628; 174/68.5
[51] Int. Cl.² ........................................ B41M 3/08
[58] Field of Search .................... 29/625, 626, 628; 174/68.5, 117 F, 117 FF, 117 PC, 117 A; 317/101 B, 101 CE, 101 F; 228/136, 141, 164, 170, 172, 180

[56] References Cited
UNITED STATES PATENTS

| | | | |
|---|---|---|---|
| 2,889,393 | 6/1959 | Berger | 29/625 X |
| 2,974,284 | 3/1961 | Parker | 29/625 X |
| 3,272,909 | 9/1966 | Bruck et al. | 29/625 X |
| 3,354,543 | 11/1967 | Lawrence et al. | 174/68.5 X |
| 3,557,446 | 1/1971 | Charschan | 29/625 |
| 3,882,264 | 5/1975 | Travis | 29/625 X |

FOREIGN PATENTS OR APPLICATIONS 1,665,015 12/1970 Germany .......................... 174/68.5

646,314 11/1950 United Kingdom ................ 174/68.5

Primary Examiner—Milton S. Mehr
Assistant Examiner—James R. Duzan
Attorney, Agent, or Firm—Warren D. Hill

[57] ABSTRACT

A single sided printed circuit board on a rigid substrate is prepared in a conventional manner, such as etching, with a first circuit including pads at the desired sites of interfacial connections. A rectangular hole is punched through the substrate at each inconnect site. A conductive foil is bonded to the other side of the substrate and a second circuit pattern is etched from the foil with circuit paths overlying the apertures. Then portions of the second circuit are inserted through the apertures by a gang of piercing tools so that the second circuit portions lie adjacent the pads of the first circuit. The interfacial connections are then completed by dip soldering or by welding. Alternatively, the second circuit applied to the substrate may be in the form of a preformed circuit on a flexible substrate.

3 Claims, 6 Drawing Figures

DOUBLE SIDED PRINTED CIRCUIT BOARD AND METHOD FOR MAKING SAME

This invention relates to double sided printed circuit boards with interfacial connections and a method for making the same.

It is common practice in fabricating electronic circuits to utilize double sided printed circuit boards with a large number of interfacial connections. It is, of course, desirable that the connections be reliable and inexpensive. Commonly, plate through holes are used to make the connection from one board face to the other. This type of interconnection has proved to be wanting in reliability due to breaks which occur during thermal expansion and contraction of the substrate. An alternate type of interconnect involves the use of staples inserted through the board, however, that method is expensive and the nature of the staple inserting equipment limits the number of interconnections per circuit board to a low value. Moreover, circuit design changes requiring a relocation of a staple are exceedingly time consuming due to the difficulty of modifying the staple inserting equipment.

It is an object of this invention to provide a circuit board with interfacial connections which are inexpensive and more reliable than plated through holes and to provide a method of making such a circuit board.

It is another object of this invention to provide such a circuit board and method wherein a high density of interconnections is possible and wherein it is relatively easy to change the interconnect sites to accommodate changes in circuit design.

The invention is carried out by providing a double sided circuit board with apertures through the substrate and through portions of a first circuit on one side of the board. Portions of the second circuit on the other side of the board extend through the apertures and are electrically connected with the first circuit adjacent the apertures.

The invention is further carried out by forming a first circuit on one side of a substrate, forming apertures through the substrate at sites where interfacial connections are desired, applying a second circuit to the other side of the substrate with conductor portions overlying the apertures, deforming portions of the second circuit to extend through the apertures, and connecting such portions of the second circuit with adjacent portions of the first circuit.

The above and other advantages will be made more apparent from the following specification taken in conjunction with the accompanying drawings wherein like reference numerals refer to like parts and wherein.

Figure 1:
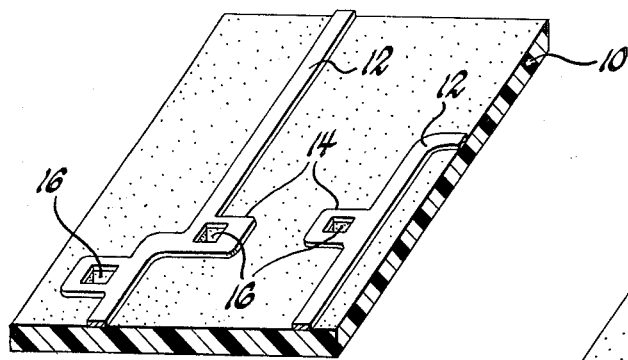
FIG. 1 is an orthogonal view of a portion of a partially completed circuit board according to the invention showing one side thereof.

FIG. 1 shows a printed circuit substrate 10 preferably of the rigid variety and utilizing any conventional circuit board material. Printed circuit conductors or paths 12 are formed on one side of the substrate 10. Preferably the circuit is formed by a conventional etching process performed on a substrate which is copper clad on one side only. The circuit paths 12 include enlarged pads 14 at each site where an interconnection to the opposite face to the board is desired. If needed, solder resist is applied to all portions of the circuit 12 which ultimately is to be free of solder.

Figure 2:
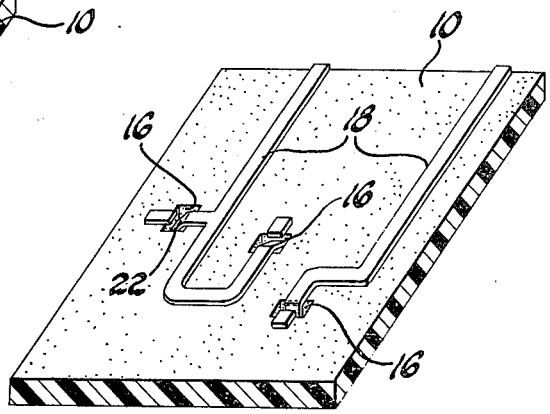
FIG. 2 is an orthogonal view of a complete circuit board showing the other side thereof.
Figure 3:
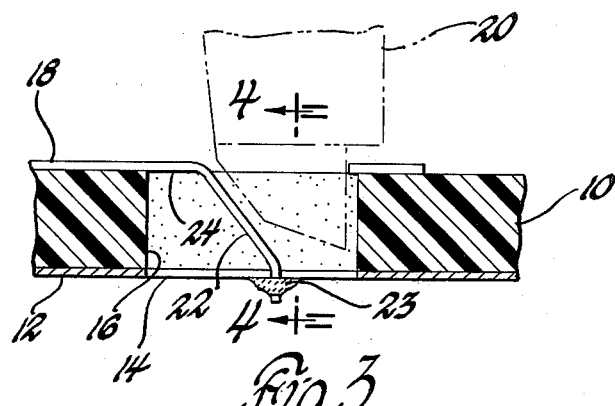
FIG. 3 is a cross-sectional detail showing an interconnection portion of the circuit board in FIG. 2 as well as a piercing tool.
Figure 4:
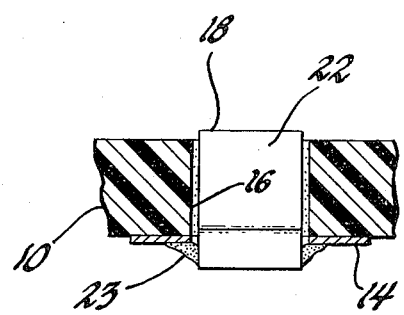
FIG. 4 is a view of the detail of FIG. 3 taken along lines 4—4.

Apertures 16 are punched through the conductors 12 at each pad 14 and through the substrate. Then as shown in FIG. 2, printed circuit conductors 18 are applied to the opposite side of the substrate 10 such that initially the conductors 18 extend across the apertures 16. According to one embodiment of the invention, the circuit 18 is formed by bonding a conductive foil to the substrate and etching the desired circuit pattern. Again, solder resist is selectively applied to desired portions of circuit 18. At this point components, not shown, may be inserted in the circuit board in the usual manner. Then as shown in FIGS. 3 and 4, a portion of each conductor 18 overlying an aperture 16 is deformed by a piercing tool 20 to form a tab portion 22 which extends through the aperture to a portion adjacent a pad 14 of circuit 12. The circuit is dip soldered to form a solder joint 23 between the tab 22 and the adjacent pad 14 thereby completing the interconnection from one substrate face to the other at the same time that the components are soldered to the circuit board.

It is to be understood that the apertures may be quite small, for example a 0.062 by 0.128 inch rectangle, although the specific dimensions will be dictated by the thickness of the substrate and other circuit design criteria. It should be noted that the piercing tool 20 is so shaped and dimensioned that the tab 22 has a strain relief design that is due to the horizontal portion 24 of the tab 22. As thermal expansion changes the thickness of the substrate, the tab 22 is able to freely flex without imposing a significant stress on the solder joint 23.

The conductors 18 optionally may be configured so that they contain pads surrounding each aperture similar to the pads 14 in FIG. 1. The tab 22 is then formed in the same way by the piercing tool, it being necessary for the tool to sever the tab from the pad along its sides as well as across the width of the tab.

Figure 5:
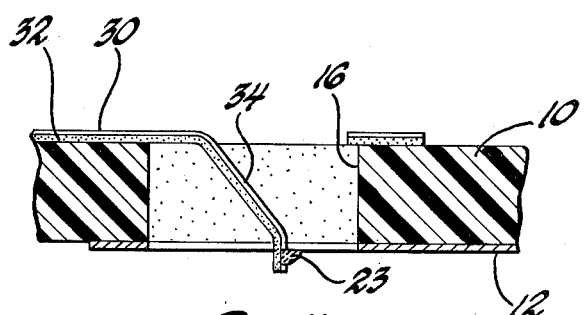
FIG. 5 is a cross-sectional detail view of an interconnection site according to another embodiment of the invention.

FIG. 5 illustrates an alternative embodiment in which the conductors 12 are formed in the manner described above but the conductors 30 on the opposite side of the substrate are preformed on a separate flexible substrate 32 which is bonded to the substrate 10 after the apertures 16 are formed in the substrate. The tabs 34 extending through the apertures 16 are formed in the same manner as the tabs 22 in the embodiment of FIG. 3 with the flexible substrate remaining attached to the conductor portion of the tab. A solder joint 23 completes the interconnection between the tab 34 and the circuit 12. The preformed flexible circuit 30, 32 need not be limited to the boundaries of the substrate 10 but rather it may extend beyond the boundaries to serve, for example, as a preformed cable leading to a connector or to another circuit unit.

It should be recognized that in the embodiment of FIG. 5 as well as in the first described embodiment, the interconnecting tabs 22 and 34 are preferably formed simultaneously by a gang of piercing tools mounted on a die.

A high density of piercing tools can be attained on a single die to allow a large number of interfacial connections on a circuit board. The piercing tools can be relocated on the die without an exceedingly long delay in order to permit reasonably rapid changes in circuit design.

Figure 6:
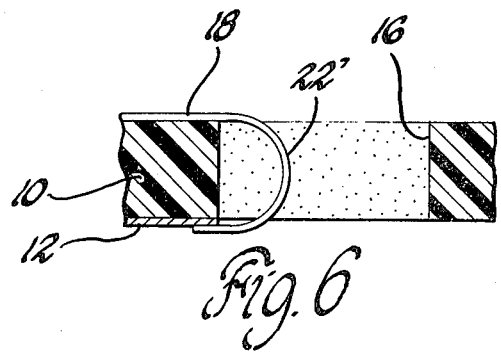
FIG. 6 is a cross-sectional view of an interconnection detail for still another embodiment.

FIG. 6 shows another modification of the circuits of FIG. 1–4. There the tab 22' is formed into a U-shape so that it makes flat contact with the circuit 12. Then the circuit connection is secured by soldering, resistance welding or ultrasonic welding, for example. It will be apparent that the previous embodiments are also subject to modification, allowing the tabs 22 or 34 to overlap some portion of the pad 14 in a position suitable to perfect a bond by welding.

Thus it is apparent that the circuit board interconnection according to this invention is inexpensive and suitable for high density interconnections and is reliable by virtue of the very low stresses produced by thermal expansion.

The embodiments of the invention in which an exclusive property or privilege is claimed are defined as follows:

1. The method of fabricating a double sided printed circuit board with electrical interconnections through the board comprising
   forming conductive paths on a first side of an insulated substrate, the paths extending to desired interconnection sites,
   forming an aperture through the substrate at the site of each desired interconnection,
   providing conductive paths on the second side of the substrate with portions of said paths overlying the apertures,
   deflecting each portion of said path overlying an aperture through the aperture to form an integral tab connection having a free end extending through the aperture to a position adjacent a path on the first side of the substrate, and
   connecting the tab connector with the path on the first side of the substrate.

2. The method of fabricating a double sided printed circuit board with electrical interconnection through the board comprising
   forming first conductive paths on a first side of an insulated substrate,
   punching an aperture in the substrate and within a conductive path at the site of each desired interconnection,
   bonding a layer of metal to the second side of the substrate,
   forming second conductive paths from the layer of metal with portions of the conductive paths overlying the apertures,
   simultaneously piercing the portions of the second conductive paths overlying the apertures and forming said pierced portions through said apertures to thereby form tabs extending through the apertures adjacent the first paths, and
   bonding the tabs with the first paths to form interconnections between the first and second paths.

3. The method of fabricating a double sided printed circuit board with electrical interconnections through the board comprising
   forming first conductive paths on one side of an insulated rigid substrate, the paths extending to desired interconnection sites,
   forming an aperture through the substrate at the site of each desired interconnection,
   forming second conductive paths on an insulated flexible substrate,
   securing the flexible substrate to the other side of the rigid substrate with the second conductive paths overlying the apertures,
   deforming each second conductive path overlying an aperture to form a tab extending through an aperture adjacent a first conductive path, and
   connecting the tab with the path on the first side of the substrate.

* * * * *